United States Patent
Yu et al.

(10) Patent No.: US 7,488,975 B2
(45) Date of Patent: Feb. 10, 2009

(54) ELECTRONICS DEVICES COMPRISING CONDUCTIVE MEMBERS THAT CONNECT ELECTRODES TO OTHER CONDUCTIVE MEMBERS WITHIN A SUBSTRATE AND PROCESSES FOR FORMING THE ELECTRONIC DEVICES

(75) Inventors: Gang Yu, Santa Barbara, CA (US); Shiva Prakash, Santa Barbara, CA (US)

(73) Assignee: E.I. Du Pont De Nemours & Company, Wilmington, DE (US)

( * ) Notice: Subject to any disclaimer, the term of this patent is extended or adjusted under 35 U.S.C. 154(b) by 0 days.

(21) Appl. No.: 11/637,453

(22) Filed: Dec. 12, 2006

(65) Prior Publication Data

US 2007/0085077 A1   Apr. 19, 2007

Related U.S. Application Data

(62) Division of application No. 11/025,110, filed on Dec. 29, 2004, now Pat. No. 7,189,991.

(51) Int. Cl.
 *H01L 29/08*  (2006.01)
 *H01L 35/24*  (2006.01)
 *H01L 51/00*  (2006.01)

(52) U.S. Cl. ........................................ 257/40; 313/504

(58) Field of Classification Search ........................ None
See application file for complete search history.

(56) References Cited

U.S. PATENT DOCUMENTS 6,864,638 B2 * 3/2005 Ishihara et al. ............ 315/169.3

| 7,189,991 | B2 |  | 3/2007 | Yu et al. ........................ 257/40 |
| 7,309,957 | B2 | * | 12/2007 | Park et al. ..................... 313/504 |
| 2003/0146693 | A1 | * | 8/2003 | Ishihara et al. ............... 313/504 |
| 2004/0146304 | A1 |  | 7/2004 | Choi et al. |

(Continued)

FOREIGN PATENT DOCUMENTS

WO    WO 2004/051703    8/2004

OTHER PUBLICATIONS

U.S. Appl. No. 10/625,112, filed Jul. 22, 2003, Shiva Prakash.

(Continued)

*Primary Examiner*—David Vu
*Assistant Examiner*—Tram H Nguyen
(74) *Attorney, Agent, or Firm*—John H. Lamming

(57) ABSTRACT

An electronic device includes a substrate including a pixel driving circuit, a first conductive member, and a second conductive member. The first and second conductive members are spaced apart, the first conductive member is connected to the pixel driving circuit, and the second conductive member can be part of a power transmission line. The electronic device also includes an electronic component that includes a first electrode that contacts the first conductive member, a second electrode that is connected to but does not contact the second conductive member, and an organic layer lying between the first and second electrodes. The electronic device also includes a third conductive member that is connected to the second electrode and the second conductive member, and contacts the second conductive member. In one embodiment, a process for forming the electronic device uses the second electrode as a hardmask when removing portions of the first organic layer.

9 Claims, 9 Drawing Sheets

U.S. PATENT DOCUMENTS

| | | |
|---|---|---|
| 2005/0019977 A1 | 1/2005 | Prakesh |
| 2005/0127372 A1* | 6/2005 | Ishihara et al. ................. 257/72 |
| 2006/0145606 A1* | 7/2006 | Lee ............................ 313/509 |
| 2007/0029545 A1* | 2/2007 | Striakhilev et al. ............ 257/40 |
| 2007/0085938 A1* | 4/2007 | Yamazaki et al. ............. 349/43 |
| 2007/0257606 A1* | 11/2007 | Winters et al. .............. 313/505 |

OTHER PUBLICATIONS

CRC Handbook of Chemistry and Physics, 81$^{st}$ Edition, 2000 (Book Not Included).

* cited by examiner

ELECTRONICS DEVICES COMPRISING CONDUCTIVE MEMBERS THAT CONNECT ELECTRODES TO OTHER CONDUCTIVE MEMBERS WITHIN A SUBSTRATE AND PROCESSES FOR FORMING THE ELECTRONIC DEVICES

BACKGROUND OF THE INVENTION

1. Field of the Invention

The invention relates generally to organic electronic devices, and more particularly to electronic devices comprising conductive members that connect electrodes to other conductive members within a substrate and processes for forming the electronic devices.

2. Description of the Related Art

Electronic devices, including organic electronic devices, continue to be more extensively used in everyday life. Examples of organic electronic devices include Organic Light-Emitting Diodes ("OLEDs"). OLEDs, which are examples of electronic components, can be used in passive matrix displays and active matrix displays. Making connections within active matrix displays are more complicated than passive matrix displays because pixel driving circuits lie within an array. A conventional design for an active matrix OLED display includes a common cathode that provides $V_{ss}$ to electronic components within the array. The common cathode design may complicate connections because the $V_{ss}$ connection may be at a significantly different elevation, with respect to pixel driving circuits, compared to connections for select (scan) lines, data lines, and $V_{dd}$ lines.

$V_{ss}$ lines can be placed on or within the substrate. The connections between the cathodes and the $V_{ss}$ lines can be incorporated into an encapsulation scheme. However, such a design can make encapsulation significantly more complicated and reduce manufacturing margins in making a proper seal to keep air, water, and other contaminants away from the OLEDs and circuits within the electronic device.

SUMMARY OF THE INVENTION

An electronic device includes a substrate including a first pixel driving circuit, a first conductive member, and a second conductive member. The first and second conductive members are spaced apart from each other, the first conductive member is connected to the first pixel driving circuit, and the second conductive member is part of a power transmission line. The electronic device also includes a first electronic component that includes a first electrode that contacts the first conductive member, a second electrode that is connected to but does not contact the second conductive member, and an organic layer lying between the first and second electrodes. The electronic device also includes a third conductive member that is connected to the second electrode and the second conductive member, and contacts the second conductive member.

In one embodiment, a process for forming an electronic device includes forming a first electrode over a first conductive member within a substrate. The substrate includes a first pixel driving circuit, the first conductive member, and a second conductive member. The first and second conductive members are spaced apart from each other. The first conductive member is connected to the first pixel driving circuit, and the second conductive member is part of a power transmission line. The process also includes forming a first organic layer over the first and second electrodes, and forming a second electrode over the first organic layer, wherein the second electrode does not lie over the second conductive member. The process further includes removing an exposed portion of the first organic layer that is not covered by the second electrode to expose the second conductive member. The process still further includes forming a third conductive member that is connected to the second electrode and the second conductive member, and contacts the second conductive member.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
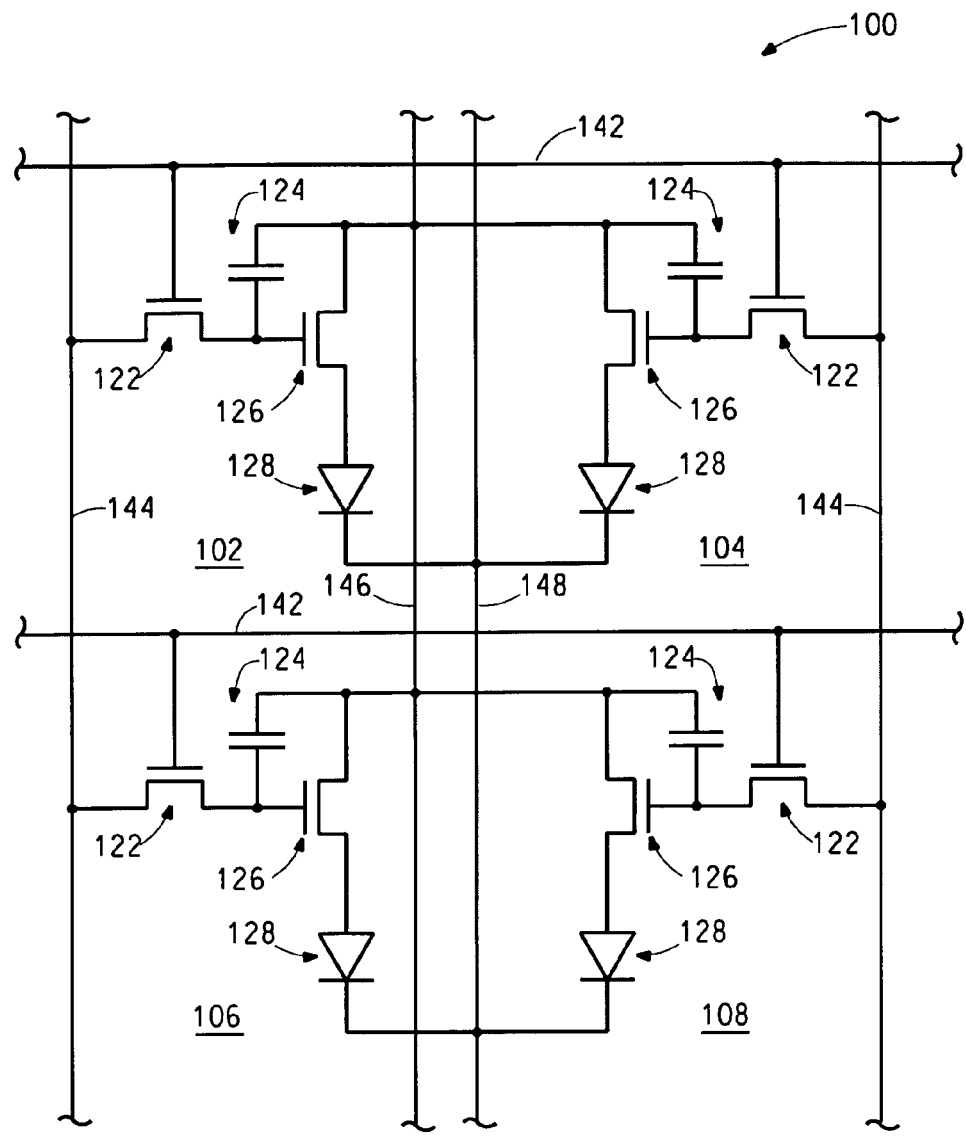
FIG. 1 includes a circuit diagram of a portion of an array within an electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device includes a substrate including a first pixel driving circuit, a first conductive member, and a second conductive member. The first and second conductive members are spaced apart from each other, the first conductive member is connected to the first pixel driving circuit, and the second conductive member is part of a power transmission line. The electronic device also includes a first electronic component that includes a first electrode that contacts the first conductive member, a second electrode that is connected to but does not contact the second conductive member, and an organic layer lying between the first and second electrodes. The electronic device also includes a third conductive member that is connected to the second electrode and the second conductive member, and contacts the second conductive member.

In another embodiment, the substrate includes a plurality of pixel driving circuits including the first pixel driving circuit. The substrate also includes additional first conductive members and additional second conductive members. Each of the first conductive members is spaced apart from each of the second conductive members. The electronic device includes an array of electronic components including the first electronic component. Each of the electronic components includes a first electrode that contacts at least one of the first conductive members, and a second electrode that is connected to at least one of the second conductive members but does not contact any of the second conductive members. The organic layer lies between the first and second electrodes. The third conductive member is connected to second electrodes and the second conductive members and contacts at least some of the second conductive members.

In a specific embodiment, the electronic components include a second electronic component that lies along a same row or a same column as the first electronic component. In another specific embodiment, the electronic components include a second electronic component that lies along a different row and a different column as the first electronic component. In still another specific embodiment, the third conductive member contacts the second electrodes of some, but not all, of the electronic components. In yet another specific embodiment, the third conductive member contacts substantially all the second conductive members within the array.

In still another embodiment, the third conductive member contacts the second conductive electrode. In yet another embodiment, the organic layer includes a conductive portion that lies between the first and second electrodes and a resistive portion that substantially prevents the second conductive member and third conductive member from contacting the conductive portion. In a further embodiment, the electronic device further includes a sidewall spacer that insulates the third conductive member from the organic layer.

In yet a further embodiment, the organic layer includes an organic active layer. In a specific embodiment, the first electronic component includes a radiation-emitting electronic component or a radiation-responsive electronic component. In another embodiment, the power transmission line is a $V_{dd}$ line or a $V_{ss}$ line.

In one embodiment, a process for forming an electronic device includes forming a first electrode over a first conductive member within a substrate. The substrate includes a first pixel driving circuit, the first conductive member, and a second conductive member. The first and second conductive members are spaced apart from each other. The first conductive member is connected to the first pixel driving circuit, and the second conductive member is part of a power transmission line. The process also includes forming a first organic layer over the first and second electrodes, and forming a second electrode over the first organic layer, wherein the second electrode does not lie over the second conductive member. The process further includes removing an exposed portion of the first organic layer that is not covered by the second electrode to expose the second conductive member. The process still further includes forming a third conductive member that is connected to the second electrode and the second conductive member, and contacts the second conductive member.

In another embodiment, removing the exposed portion of the first organic layer forms a sidewall adjacent to the second conductive member. The process further includes forming a resistive portion of the first organic layer adjacent to the sidewall. In a specific embodiment, forming the resistive portion of the first organic layer includes exposing the first organic layer to a dry processing operation.

In still another embodiment, the process further includes forming an insulating layer after removing the exposed portion of the first organic layer. The process also includes anisotropically etching the insulating layer to form a sidewall spacer along a sidewall of the exposed portion of the first organic layer.

In yet another embodiment, the substrate includes a plurality of pixel driving circuits including the first pixel driving circuit, additional first conductive members, and additional second conductive members. Each of the first conductive members is spaced apart from the second conductive members. The electronic device includes an array of electronic components and the pixel driving circuits lie within the array. Forming the first electrode includes forming the first electrodes over the first conductive members. Forming the second electrode includes forming the second electrodes over the first organic layer, wherein the second electrodes do not lie over any of second conductive members within the array. Removing the portion of the first organic layer includes removing portions of the first organic layer that are not covered by the second electrode to expose the second conductive members. Forming the third conductive member includes forming the third conductive member such that it is connected to the second electrodes and the second conductive members and contacts at least some of the second conductive members.

In a further embodiment, the process further includes forming an organic active layer after forming the first electrode and before forming the second electrode. In a specific embodiment, the first electronic component includes a radiation-emitting electronic component or a radiation-responsive electronic component.

In yet a further embodiment, the third conductive member contacts the second electrode. In still a further embodiment, the power transmission line is a $V_{dd}$ line or a $V_{ss}$ line.

Other features and advantages of the invention will be apparent from the following detailed description, and from the claims. The detailed description first addresses Definitions and Clarification of Terms followed by the Layout and Fabrication Process, Alternative Embodiments, and Advantages.

1. Definitions and Clarification of Terms

Before addressing details of embodiments described below, some terms are defined or clarified. As used herein, the term "active" when referring to a layer or material is intended to mean a layer or material that exhibits electro-radiative or electromagnetic properties. An active layer material may emit radiation or exhibit a change in concentration of electron-hole pairs when receiving radiation.

The terms "array," "peripheral circuitry" and "remote circuitry" are intended to mean different areas or components. For example, an array may include pixels, cells, or other electronic devices within an orderly arrangement (usually designated by columns and rows) within a component. These electronic devices may be controlled locally on the component by peripheral circuitry, which may lie within the same component as the array but outside the array itself. Remote circuitry typically lies away from the peripheral circuitry and can send signals to or receive signals from the array (typically via the peripheral circuitry). The remote circuitry may also perform functions unrelated to the array.

The terms "conductive member" is intended to mean a member or structure, wherein current can flow through such member or structure without a significant drop in potential. Electrodes, terminals, and interconnects are examples of conductive members.

The term "connected," with respect to electronic components, circuits, or portions thereof, is intended to mean that two or more electronic components, circuits, or any combination of at least one electronic component and at least one circuit do not have any intervening electronic component lying between them. Note that such electronic components, circuits, or portions thereof may or may not contact one another. Parasitic resistance, parasitic capacitance, or both are not considered electronic components for the purposes of this definition. In one embodiment, electronic components are connected when they are electrically shorted to one another and lie at substantially the same voltage. Note that electronic components can be connected together using fiber optic lines to allow optical signals to be transmitted between such electronic components.

The term "contact" is intended to mean that two or more objects physically touch one another.

The term "dry processing operation" is intended to mean a portion of a process that changes the chemical of physical properties of a layer, material, member, or structure that is performed without a liquid. An example of a dry processing operation includes dry etching, laser ablation, or a combination thereof.

The term "electrode" is intended to mean a member or structure configured to transport carriers within an electronic component. For example, an electrode may be an anode, a cathode, a capacitor electrode, a gate electrode, etc.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductive member laser, an optical switch, or the like. An electronic component does not include parasitic resistance (e.g., resistance of a wire) or parasitic capacitance (e.g., capacitive coupling between two conductive members connected to different electronic components where a capacitor between the conductive members is unintended or incidental).

The term "electronic device" is intended to mean a collection of circuits, electronic components, or combinations thereof that collectively, when properly connected and supplied with the appropriate potential(s), performs a function. An electronic device may include or be part of a system. An example of an electronic device includes a display, a sensor array, a computer system, an avionics system, an automobile, a cellular phone, or other consumer or industrial electronic product.

The term "insulating" and its variants are intended to mean a material, layer, member, or structure having an electrical property such that it substantially prevents a significant number of charge carriers from flowing through such material, layer, member or structure.

The term "isotropic etch" is intended to mean an etch that occurs substantially equally in vertical and horizontal directions from a cross-sectional view of a substrate. The term "anisotropic etch" is intended to mean an etch that occurs at a significantly higher rate in a one direction compared to another direction when etching the same material. Although no etch is entirely isotropic or anisotropic, etches tend to be significantly more isotropic or anisotropic compared to the other (of anisotropic or isotropic).

The term "pixel" is intended to mean the smallest complete unit of a display as observed by a user of the display. The term "subpixel" is intended to mean a portion of a pixel that makes up only a part, but not all, of a pixel. In a full-color display, a full-color pixel can comprise three sub-pixels with primary colors in red, green and blue spectral regions. A monochromatic display may include pixels but no subpixels.

The term "pixel driving circuit" is intended to mean a circuit within an array of pixels or subpixels that controls the signal(s) for no more than one pixel. Note that a driving circuit that controls the signal(s) for only one subpixel, and not the entire pixel, is still referred to as a pixel driving circuit, as used in this specification.

The term "power transmission line" is intended to mean one or more conductive members within an electronic device designed to transmit a power supply signal. The one or more conductive members are at substantially the same voltage as the power supply signal. An example of a power transmission line includes a $V_{dd}$ line or a $V_{ss}$ line.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is an example of a radiation-emitting component.

The term "radiation-responsive component" is intended to mean an electronic component can sense or respond to radiation at a targeted wavelength or spectrum of wavelengths. The radiation may be within the visible-light spectrum or outside the visible-light spectrum (UV or IR). Photodetectors, IR sensors, biosensors, and photovoltaic cells are examples of radiation-responsive components.

The term "resistive" when referring to a material is intended to mean a material having an electrical resistance between that of a conductive member and an insulator. For example, a resistive material has a resistivity in a range of approximately $10^{-2}$ to $10^{+4}$ ohm-cm.

The term "sidewall spacer" is intended to mean a structure lying along a sidewall of an opening that is used to separate a conductive member or resistor lying within the opening from a different conductive member or resistor lying along the sidewall of the opening.

The term "substrate" is intended to mean a workpiece that can be either rigid or flexible and may include one or more layers of one or more materials, which can include, but are not limited to, glass, polymer, metal or ceramic materials, or combinations thereof.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an "inclusive or" and not to an "exclusive or." For example, a condition A or B is satisfied by any one of the following: A is true (or present) and B is false (or not present), A is false (or not present) and B is true (or present), and both A and B are true (or present).

Additionally, for clarity purposes and to give a general sense of the invention, the use of the "a" or "an" are employed to describe elements and components of the invention. This description should be read to include one or at least one and the singular also includes the plural unless it is clear that it is meant otherwise.

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Group numbers corresponding to columns within the Periodic Table of the elements use the "New Notation" convention as seen in the *CRC Handbook of Chemistry and Physics*, 81$^{st}$ Edition (2000).

To the extent not described herein, many details regarding specific materials, processing acts, and circuits are conventional and may be found in textbooks and other sources within the organic light-emitting diode display, photodetector, and semiconductive member arts.

2. Layout and Fabrication Process

FIG. 1 includes a circuit diagram of a portion of an array within an electronic device 100 including pixels 102, 104, 106, and 108. In an alternative embodiment, each of the pixels 102, 104, 106, and 108 can be sub-pixels. For the purposes of this specification, the term pixel will be used although skilled artisans will appreciate that the concepts described herein can be extended to sub-pixels within pixels. As illustrated in FIG. 1, each of the pixels 102, 104, 106, and 108 include a pixel driving circuit that includes a select transistor 122, a storage capacitor 124, and a driving transistor 126. A gate electrode of the select transistor 122 is connected to a select line 142. In one embodiment, the select lines 142 are activated as a function of time, and therefore, each select line 142 is a scan line. A first source/drain region of select transistor 122 is connected to a data line 144. A second source/drain region of the select transistor 122, a first electrode of the storage capacitor 124, and the gate electrode of the driving transistor 126 are connected to one another. A first source/drain region of the driving transistor 126 is connected to an anode of an electronic component 128. In one embodiment, the electronic components 128 are radiation-emitting components, and in another embodiment, the electronic components 128 are radiation-responsive components. A cathode of the electronic components 128 is connected to a power transmission line, which in this embodiment is a $V_{ss}$ line 148. A second electrode of the storage capacitor 124 and a second source/drain region of the driving transistor 126 are connected to another power transmission line, which in this embodiment is a $V_{dd}$ line 146. After reading this specification, skilled artisans will appreciate that the array may extend in one or more directions and may include nearly any finite number of pixels similar to the ones illustrated in FIG. 1.

In other embodiments, other electronic components may be used in place of or in conjunction with the electronic components illustrated in FIG. 1. For example, one or more p-channel transistors can be used in place of or in conjunction with the n-channel transistors illustrated in FIG. 1. The exact type and configuration of electronic components within the pixel driving circuits are highly variable and can be chosen to fit the needs or desires for a particular application. After reading this specification, skilled artisans will appreciate that anodes of the electronic components 128 may be connected to the $V_{dd}$ line 146, and cathodes of the electronic components 128 may be connected to source/drain regions of the driving transistors 126. The other source/drain regions of the driving transistors 126 may be connected to the $V_{ss}$ line 148.

The layout and fabrication of the electronic device 100 in accordance with the circuit diagram illustrated in FIG. 1 is described below. After reading this specification, skilled artisans will appreciate that the invention is not limited to the specific circuit diagram, layouts, and fabrication processes described herein.

Figure 2:
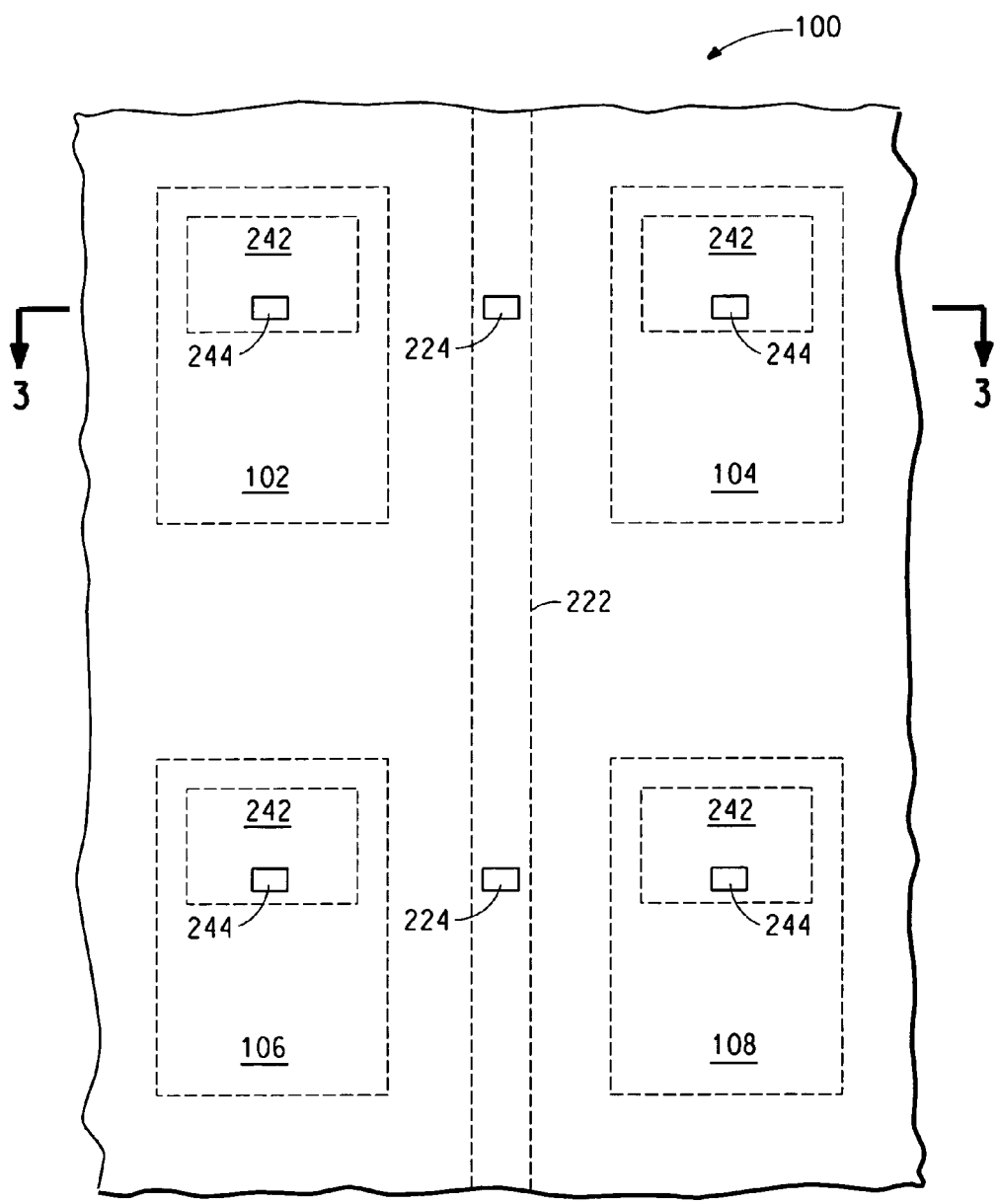
FIGS. 2 and 3 include illustrations of a plan view and a cross-sectional view, respectively, of a portion of substrate after forming openings to exposed conductive members for the pixel driving circuits and $V_{dd}$ line.
Figure 3:
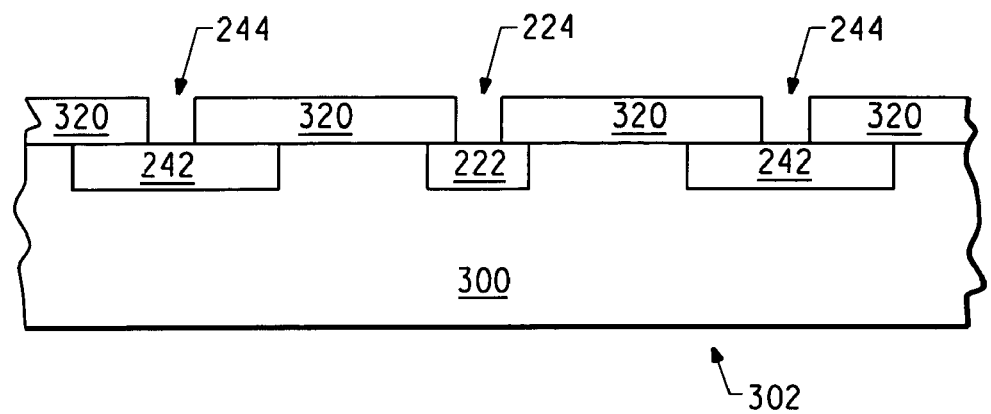

FIGS. 2 and 3 include illustrations of a plan view and a cross-sectional view, respectively, of a portion of a substrate after forming openings that expose first and second conductive members. Referring to FIG. 2, areas that will correspond to the pixels 102, 104, 106, and 108 are illustrated with one set of dashed lines, and pixel driving circuits 242 are illustrated with dashed line boxes within the pixels 102, 104, 106, and 108. First conductive members lie at the bottom of openings 244, and each are connected to the underlying pixel driving circuit. The first conductive members are part of or connected to the second source/drain regions of the driving transistors 126. A second conductive member 222 lies at the bottom of openings 224. The second conductive member 222 is part of a power transmission line, which in this embodiment is a $V_{ss}$ line 148. Referring to FIG. 3, which is a cross-sectional view at the sectioning line 3-3 in FIG. 2, the pixel driving circuits 242 and the second conductive member 222 lie within a substrate 300. Each of the substrate 300, pixel driving circuits 242, including first conductive members, and the second conductive member 222 include materials and are formed using conventional techniques. In one embodiment, the substrate 300 is rigid, and in another embodiment is flexible. In one specific embodiment, the substrate 300 is transparent and includes a user side 302 opposite a surface of the substrate 300 where electronic device formation occurs.

An insulating layer 320 is formed over the substrate 300, pixel driving circuits 242, and second conductive member 222. The insulating layer 320 can include silicon dioxide, silicon nitride, organic insulating material, or any combination thereof. The insulating layer 320 can be formed by depositing using a conventional technique. The insulating layer 320 has a thickness that is sufficient to insulate a subsequently-formed electrode or other conductive members from underlying electronic components within the substrate 300. In one embodiment, the insulating layer 320 has a thickness in a range of approximately 0.1-5.0 microns. A conventional lithographic operation is performed to form openings 224 and 244 within the insulating layer 320. After reading this specification, skilled artisans will appreciate that more or fewer openings 224 or 244 may be formed. The number of openings 224, 244, or a combination thereof can include one opening per pixel or sub-pixel or group of pixels or sub-pixels. For example, one opening 224 may be used for a pixel that include red, green, and blue sub-pixels. In another embodiment, the number of openings for each pixel or sub-pixel can be more than one. To list all the combinations would be nearly impossible. Also, although not illustrated, any one or more of the pixel driving circuits 224 may or may not be connected to the second conductive member 222. As previously stated, the layout options are many, and after reading this specification, skilled artisans will understand how to design a layout that best meets their needs or desires.

At this point in the process, first conductive members within the pixel driving circuits 242 and the second conductive member 222 are exposed. The first conductive members and second conductive member 242 and 222 can include at least one element selected from Groups 4-6, 8 and 10-14 of the Periodic Table, or any combination thereof. In one embodiment, the first conductive members and second conductive member 222 can include Cu, Al, Ag, Au, Mo, or any combination thereof. In another embodiment, where the first conductive members and second conductive member 222 include more than one layer, wherein one of the layers can include can include Cu, Al, Ag, Au, Mo, or any combination thereof and another layer can include Mo, Cr, Ti, Ru, Ta, W, Si, or any combination thereof. As will be described later, the second conductive member 222 may be exposed to a base. In one embodiment, the second conductive member may include an Al layer covered by a layer of Mo, Cr, Ti, Ru, Ta, W, or any combination thereof. Note that conductive metal oxide(s), conductive metal nitride(s) or a combination thereof may be used in place of or in conjunction with any of the elemental metals or alloys thereof.

Figure 5:
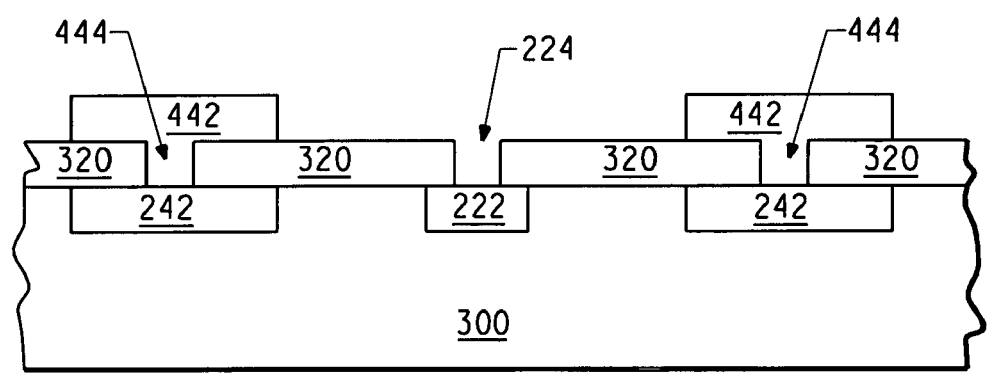
FIGS. 4 and 5 include illustrations of a plan view and a cross-sectional view, respectively, of the substrate of FIGS. 2 and 3 after forming first electrodes.
Figure 4:
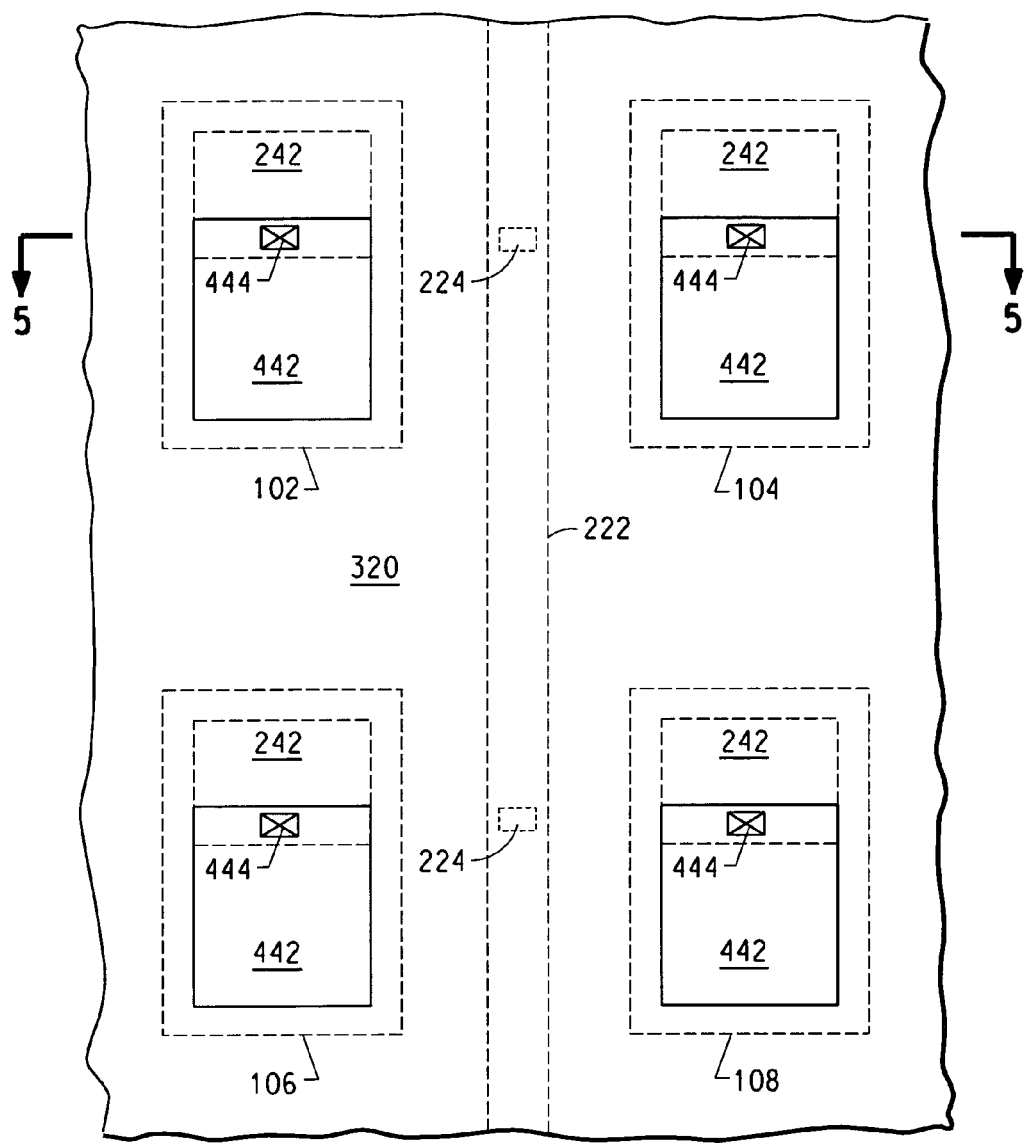

First electrodes 442 are formed over portions of the insulating layer 320 and pixel driving circuits 242 as illustrated in FIGS. 4 and 5. In one embodiment, the first electrodes 442 are anodes for the electronic components 128. Portions of the first electrodes 442 form contacts 444 to the first conductive members within the pixel driving circuits 242. In one embodiment, the first electrodes 442 are transparent to radiation to be emitted or received by the electronic components 128. In a specific embodiment, the first electrodes 442 include indium tin oxide ("ITO"), indium zinc oxide (IZO), aluminum tin oxide ("ATO"), or other metallic materials typically used for anodes in OLEDs. In this embodiment, the first electrodes 442 transmit at least 70% of the radiation to be emitted from or responded to by subsequently-formed organic active layer(s). Such radiation is emitted from or received at the user side 302 of the substrate 300. In one embodiment, the thickness of the first electrodes 442 is in a range of approximately 100-200 nm. If radiation does not need to be transmitted through the first electrodes 442, the thickness may be greater, such as up to 1000 nm or even thicker.

In one embodiment, the first electrodes 442 are formed by placing a stencil mask over the substrate 300 and using a conventional physical vapor deposition technique to deposit the first electrodes 442 as illustrated in FIGS. 3 and 4. In another embodiment, the first electrodes 442 are formed by blanket depositing one or more of the layers for the first electrodes 442. A masking layer (not shown) is then formed over portions of the layer(s) that are to remain to form first electrodes 442. A conventional etching technique is used to remove exposed portions of the layer(s) and leave the first electrodes 442. During the etching, the layer(s) overlying and within the openings 224 (to the second conductive member 222) are removed. In this embodiment, the layer(s) of the first electrodes 442 and the second conductive member 222 include different materials. The use of different materials allows the layer(s) for the first electrodes 442 to be removed selectively to the second conductive member 222. In another embodiment (not shown), the pattern of the masking layer can be changed so that portions of the layer(s) (for the first electrodes 442) may remain within the openings 224. However, such portions remaining within the openings 224 would be spaced apart from the first electrodes 442 so that a connection is not made between the first electrodes 442 and the second conductive member 222. After the etching, the masking layer is removed using a conventional technique.

Figure 6:
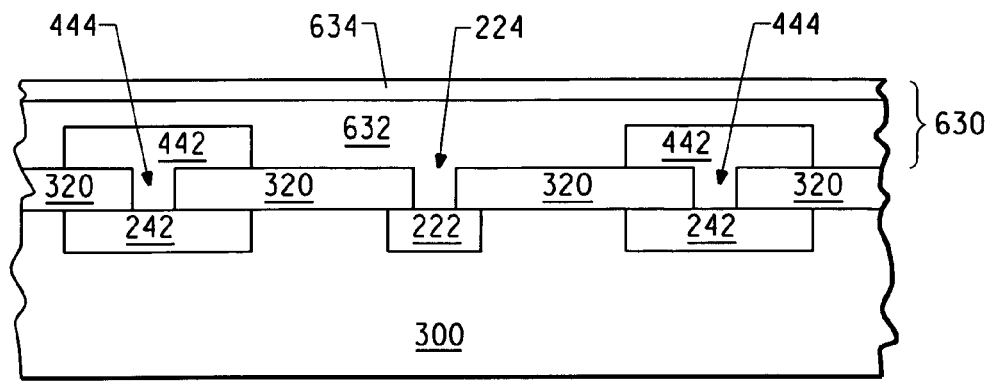
FIG. 6 includes an illustration of a cross-sectional view of the substrate of FIGS. 4 and 5 after forming an organic layer.

An organic layer 630 is formed over the first electrodes 442, the insulating layer 320, and the second conductive member 222 as illustrated in FIG. 6. The organic layer 630 may include one or more layers. For example, the organic layer can include an organic active layer, any one or more of an electron-injection layer, an electron-transport layer, an electron-blocking layer, a hole-injection layer, a hole-transport layer, or a hole-blocking layer, or any combination thereof. In one embodiment, the organic layer 630 may include a first organic layer 632 and organic active layer 634.

The first organic layer 632 and the organic active layer 634 are formed sequentially over the first electrodes 442. Each of the first organic layer 632 and the organic active layer 634 can be formed by one or more of any number of different techniques including spin coating, casting, vapor depositing (chemical or vapor), printing (ink jet printing, screen printing, solution dispensing (dispensing the liquid composition in strips or other predetermined geometric shapes or patterns, as seen from a plan view), or any combination thereof, other depositing technique or any combination thereof for appropriate materials as described below. One or both of the first organic layer 632 and the organic active layer 634 may be cured after deposition.

When the first organic layer 632 acts as a hole-transport layer, any number of materials may be used (and its selection will depend on the device and the organic active layer 634 material) and in this illustrative example, it may include one or more of polyaniline ("PANI"), poly(3,4-ethylenedioxythiophene) ("PEDOT") or material(s) conventionally used as hole-transport layers as used in organic electronic devices. The hole-transport layer typically has a thickness in a range of approximately 100-250 nm as measured over the substrate 300 at a location spaced apart from the first electrodes 442. The first organic layer 632 may be relatively conductive or relatively resistive. Sulfonated versions of PANI and PEDOT (e.g., PANI-PSS and PEDOT-PSS) are relatively conductive, whereas unsulfonated versions can be relatively resistive. In one embodiment, PANI-PSS, PEDOT-PSS, or a combination thereof may be used to reduce the voltage drop across with the first organic layer 632 when operating the electronic components 128. In one embodiment, the thickness of the first organic layer 632 is in a range of approximately 50-200 nm.

The composition of the organic active layer 634 typically depends upon the application of the electronic device. In one embodiment, the organic active layer 634 is used in radiation-emitting components. The organic active layer 634 can include material(s) conventionally used as organic active layers in organic electronic devices and can include one or more small molecule materials, one or more polymer materials, or any combination thereof. After reading this specification, skilled artisans will be capable of selecting appropriate material(s), layer(s) or both for the organic active layer 634. In one embodiment, the organic active layer 634 is no greater than 40 nm. In another embodiment, the organic active layer 634 has a thickness in a range of approximately 60-100 nm, and in a more specific embodiment, in a range of approximately 70-90 nm.

If the electronic device is a radiation-emitting microcavity device, care is taken in choosing the thickness of the organic layer 630 so that the desired spectrum of emission wavelengths is obtained.

In an alternative embodiment, the organic layer 630 may include a single layer with a composition that varies with thickness. For example, the composition nearest the first electrodes 442 may act as a hole transporter, the next composition may act as an organic active layer, and the composition furthest from the first electrodes 442 may act as an electron transporter. Similarly, the function of charge injection, charge blocking, or any combination of charge injection, charge transport, and charge blocking can be incorporated into the organic layer 630. One or more materials may be present throughout all or only part of the thickness of the organic layer.

Figure 8:
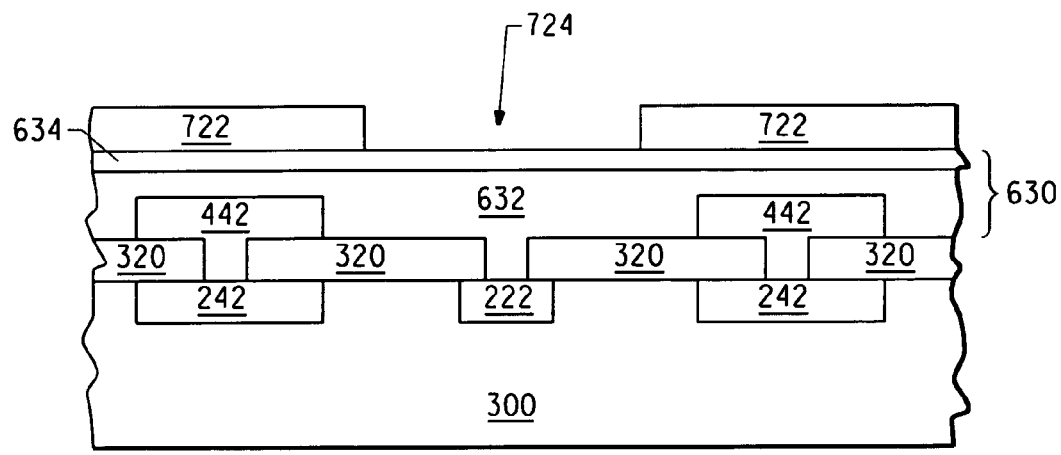
FIGS. 7 and 8 include illustrations of a plan view and a cross-sectional view, respectively, of the substrate of FIG. 6 after forming second electrodes.
Figure 7:
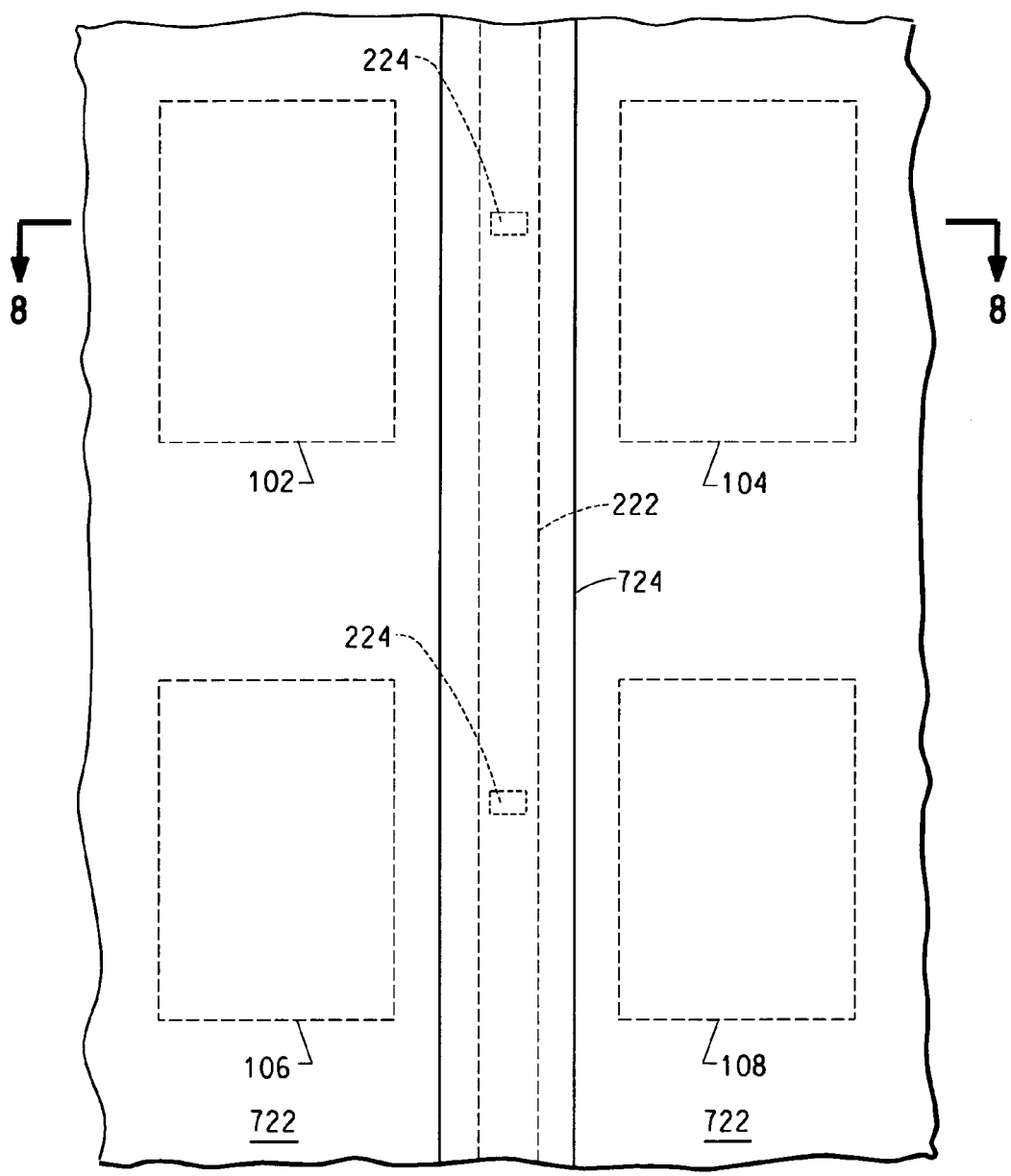

Second electrodes 722 are formed over the organic layer 630 as illustrated in FIGS. 7 and 8. In one embodiment, the second electrodes 722 are the cathodes for the electronic components 128. The second electrodes 722 include a first layer in contact with the organic layer 630 and a second layer overlying the first layer. The first layer includes one or more of a Group 1 metal, Group 2 metal, other material(s) conventionally used for cathodes within OLEDs, or any combination thereof. The second layer helps to protect the first layer and can include any one or more of the materials described with respect to the second conductive member 222. The second layer of the second electrodes 722 and the second conductive member 222 can have the same material or different materials. In an embodiment where subsequent exposure to a base occurs, the selection of materials or use of additional protective layers for the second electrodes 722 should be resistant to the base. In one embodiment, the second electrodes 722 have a thickness in a range of approximately 100-2000 nm.

The second electrodes can be formed by using a stencil mask having openings where the second electrodes 722 are to be formed. In FIGS. 7 and 8, an opening 724 between the second electrodes 722 exposes at least a portion of the organic layer 630, which in turn, overlies the second conductive member 222. The second electrodes 722 can be formed using a physical vapor deposition technique, such as evaporation or sputtering.

Figure 9:
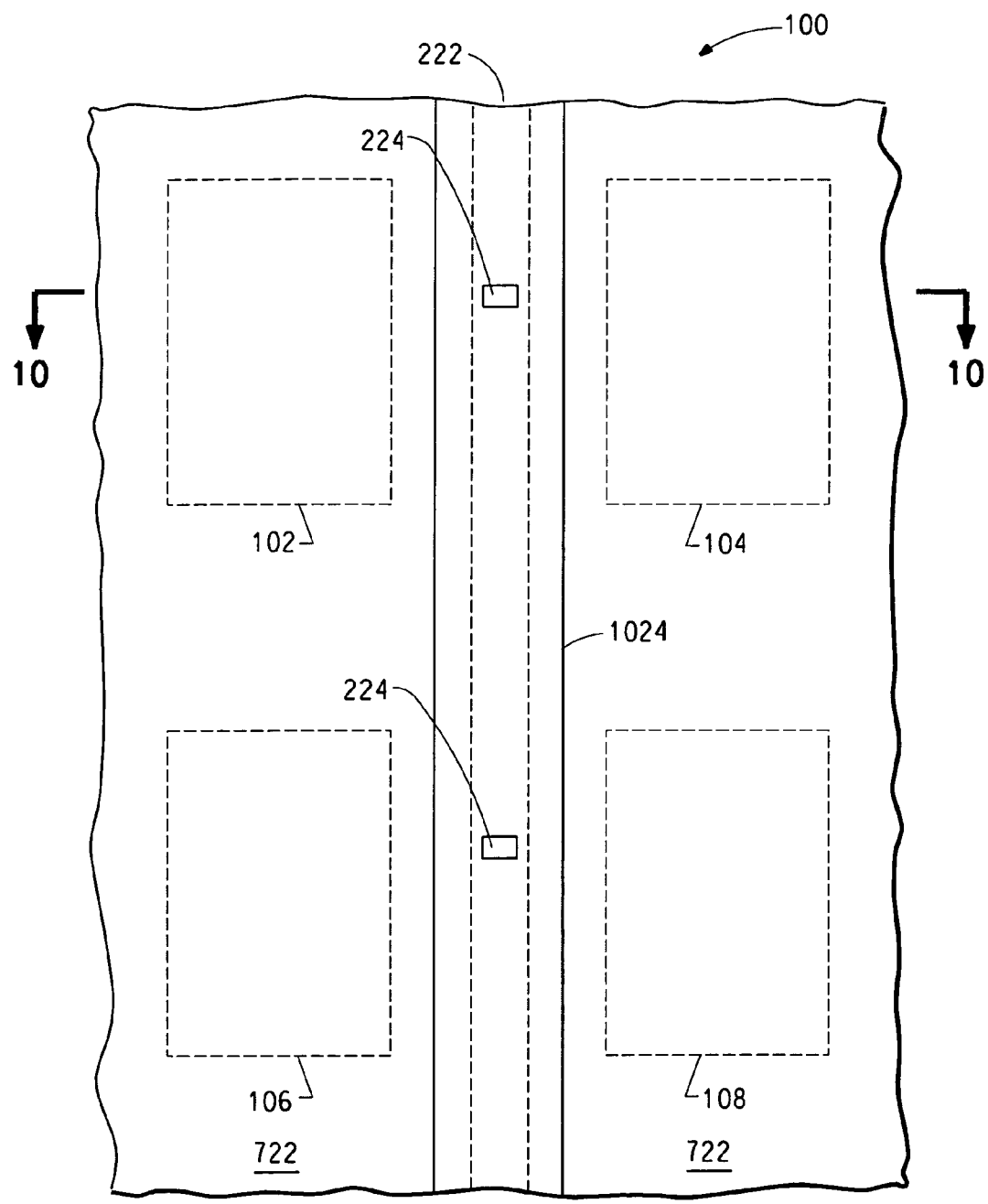
FIGS. 9 and 10 include illustrations of a plan view and a cross-sectional view, respectively, of the substrate of FIGS. 7 and 8 after etching a portion of the organic layer to form openings to a conductive member.
Figure 10:
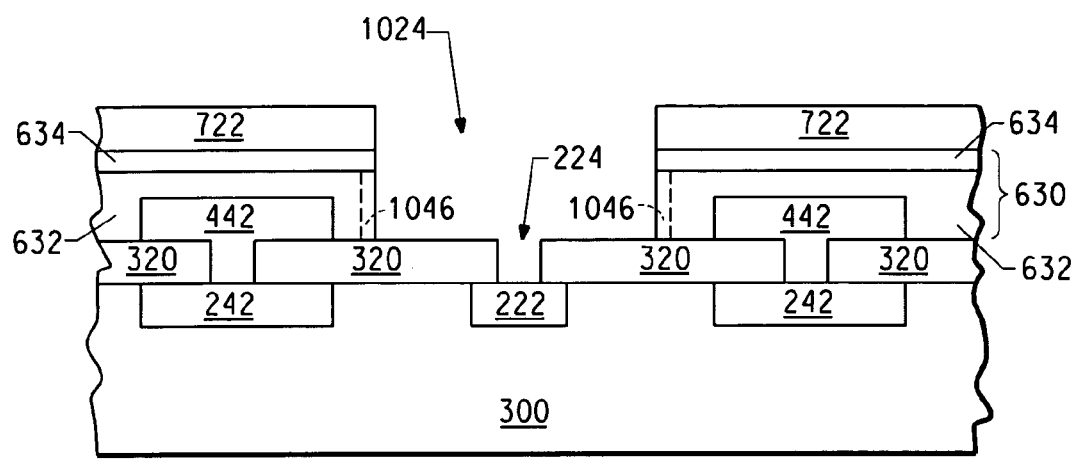

The exposed portion of the organic layer 630 is then removed from the opening 724 to expose the openings 224 to the second conductive member 222 as illustrated in FIG. 9. FIG. 10 includes an illustration of a cross-sectional view of the electronic device 100 at sectioning line 10-10 in FIG. 9. The opening 1024 extends to the insulating layer 320 and to the exposed portions of the second conductive member 222. In this embodiment, the second electrodes 722 form a hard mask during the etching of organic layer 630. The removal of the exposed portion of the organic layer 630 can be performed as a dry processing operation. An example of the dry processing operation can be performed using laser ablation or dry etching. Laser ablation is conventional. Dry etching can be performed using any one or more of the techniques described within the "Dry Etching" section of U.S. patent application Ser. No. 10/625,112 entitled "Process For Removing an Organic Layer During Fabrication of an Organic Electronic Device and the Organic Electronic Device Formed by the Process" by Shiva Prakash filed Jul. 22, 2003.

The dry etching may be performed using one or more steps. If the upper surface of the second conductive member 222 does not form an insulating oxide, and if the organic layer 630 does not contain any significant amount of non-volatile contaminants (e.g., sodium, silicon, sulfur, etc.), a single step may be used. However, in another embodiment, the upper surface of the second conductive member 222 may form an insulating oxide or the organic layer 630 may contain a significant amount of non-volatile etch products or contaminants.

In one embodiment, a two-step process is used, wherein the first step removes the organic layer 630 and a second step to remove undesired material(s), such as non-volatile etch products and contaminants. The first step has a relatively higher degree of chemical reactivity with the organic layer 630, whereas the second step has a relatively higher degree of physical removal (less selective).

The first step removes substantially all of the organic layer 630, and the second step is performed to remove undesired materials, such as non-volatile etch products and contaminants. The first step is to remove the organic layer 630 while still maintaining good selectivity to other materials that are or may become exposed during the first step. Selectivity is a measure usually expressed as a ratio or fraction of the etch rate of the targeted material to be removed (the organic layer 630 in this embodiment) to the etch rates of the other materials that are or become exposed during the first step. Higher selectivity is desired but may be limited by other considerations, such as equipment throughput and diminished anisotropic character of the etch if an anisotropic etch is desired. Also, with a plurality of different materials exposed near the end of the first step, while the selectivity of the organic layer 630 to the second conductive member 222 is optimized, the selectivity of the organic layer 630 to the second electrodes 722 may be too low. The selectivity is typically a function of the etch chemistry used. The etch chemistries are discussed in more detail below.

The second electrodes 722 are exposed during substantially all of the first step. The insulating layer 320 and second conductive member 222 become exposed after the organic layer 630 is removed. The sides of the second electrodes 722 are exposed during substantially all of the first step.

The ratio of the feed gases during the first step may be selected in part to achieve the desired selectivities. In one embodiment, the oxygen-containing gas is about 1 to 100 volume percent of the feed gas, the halogen-containing gas is 0 to 50 volume percent, the inert gas is 0 to 40 volume percent, and the reducing gas is 0 to 30 volume percent. In another embodiment, the oxygen-containing gas includes $O_2$ and is 30 to 95 volume percent of the feed gas, the halogen-containing gas includes a fluorocarbon and is 1 to 30 volume percent, and the inert gas may be selected from a group consisting of $N_2$, He, and Ar and is 4 to 30 volume percent, and the reducing gas may be selected from a group consisting of $H_2$ and $NH_3$ and is 0 to 10 volume percent. In still a further embodiment, the oxygen-containing gas is $O_2$ and is 60 to 95 volume percent of the feed gas, the halogen-containing gas is $CF_4$ and is 4 to 20 volume percent of the feed gas, the inert gas is Ar and is 10 to 20 volume percent of the feed gas, and no reducing gas is used.

The operating parameters may vary depending on the type of reactor used, size of the etching chamber, or the size of the substrate being etched. A batch etching system, such as a barrel etcher (sometimes also referred to as an asher) and a hexode reactor, may be used. Alternatively, a single substrate system, such as one with planar parallel plates may be used. During the etching, the plasma may be directly exposed to the substrate or a downstream plasma may be used. At the beginning of the first step, the substrate 10 may be loaded into the dry etching system. The feed gas(es) flow into the dry etching chamber and the pressure is allowed to stabilize. The pressure is in a range of approximately 0.01 to 5000 mTorr. At these pressures, the feed gas(es) may flow at a rate in a range of approximately 10 to 1000 standard cubic centimeters per minute ("sccm"). In another embodiment, the pressure may be in a range of approximately 100 to 500 mTorr, the feed gas(es) may flow at a rate in a range of approximately 100 to 500 sccm.

The voltage and power may be applied to generate a plasma. Power is typically a linear or near linear function of the surface area of the substrate. Therefore, power densities (in power per unit area of substrate) are given. The voltage is in a range of approximately 10 to 1000 V, and the power density is in a range of approximately 10 to 5000 mW/cm$^2$. The lower limits on voltage and power density may cause the plasma to be difficult to sustain or produce unacceptably low etch rates. The upper limits on voltage and power density may be too aggressive and cause the dry etching to be uncontrollable, irreproducible (important in manufacturing), or have unacceptably low selectivity. In one embodiment, the voltage may in a range of approximately 20 to 300 V, and the power density may be in a range of approximately 50 to 500 mW/cm . The ramp rate of the voltage and power may be quite high because the voltage and power are typically turned on and off similar to a conventional light switch.

The first step may be performed for a set time, using endpoint detection, or a combination of endpoint detection and a set time for the overetch. If the first step is too short, not all of the portions of the second conductive member 222 will be exposed causing an open circuit or highly resistive circuit to be formed in a finished device. If the first step is too long, too much of the second electrodes 722, insulating layer 320, second conductive member 222, or a combination thereof may be etched. In addition, if the first step is too long, the second electrodes 722, insulating layer 320, second conductive member 222, or a combination thereof may become pitted, or in the case of the second electrodes 722, the second conductive member 222, or a combination thereof, may cause unacceptably high contact resistance to subsequently formed conductive members.

In one embodiment, the gases, the pressure, the flow rate, power density, and voltage may be varied over time during the dry etch processes.

When a set time is used for the first step, the time may be in a range of approximately 2 to 30 minutes for a batch reactor. In another embodiment, the set time may be in a range of approximately 5 to 10 minutes for the batch reactor. For a single-substrate dry etching chamber, the etching time may be less than half the time or shorter than the times previously given. Endpoint detection may be performed using a conventional technique.

The second step may be performed using an inert gas, and optionally a reducing gas, both of which are described above. The inert gas helps to remove undesired materials left after the first step, and the reducing gas may help to reduce a metal oxide formed during the first step to its corresponding metal. In one embodiment, the second step includes the inert gas at 50 to 100 volume percent, and the reducing gas at 0 to 50 volume percent. In another embodiment, the second step includes the inert gas at 70 to 100 volume percent and the reducing gas at 0 to 30 volume percent. In still a further embodiment, the inert gas is Ar at 90 to 100 volume percent, and the reducing gas is $H_2$ at 0 to 10 volume percent.

The operating conditions during the second step lie within the widest ranges given above for the first step. The actual operating conditions used during the second step may be different from the first step. For example, the voltage and power density may be higher because the undesired materials are being physically removed as opposed to chemically etched. During the second step, the voltage may be in a range of approximately 10 to 600 V, and the power density may be in a range of approximately 100 to 1000 mW/cm$^2$. If the voltage or power density is too high, the second step may remove too much of the underlying materials, may be uncontrollable or irreproducible. The second step is typically performed as a timed etch. After the second step, the voltage, power, and feed gases are turned off. The dry etching chamber is pumped down and purged. After purging, the dry etching chamber is vented to approximately atmospheric pressure and the substrate is removed.

After the etching operation is completed, portions of the insulating layer 320 and second conductive member 222 are visible as seen in FIG. 9. Although not shown in FIG. 9, other portions of conductive leads or conductive members formed before the organic layer 630 (e.g., conductive leads for peripheral or remote circuitry outside the array) may become exposed. The organic layer 630 is removed from the peripheral and remote circuitry areas. One of those areas may or may not include the rail, which is the area where a subsequently formed encapsulation layer is attached. Exposed portions of conductive members or leads not shown in FIG. 9 may correspond to bond pads to allow electrical connections to be made to the circuits on or within the substrate 300.

While many different gases and operation conditions have been described with respect to the dry etching, the dry etching should be as gentle as possible while still maintaining acceptable etch rates and removal of undesired materials. Organic electronic devices tend to be more sensitive to processing conditions compared to their inorganic electronic device counterparts.

Any number of commercially available dry etching systems are suitable for use with the present invention, including the Plasma Therm 790 Series from Unaxis and the March PX-500 from March Plasma Systems. In typical capacitively-coupled plasma etchers, called reactive ion etchers (RIE), the pressure range of operation is between 100 mTorr and 1 Torr. To operate at lower pressures, down to 1 mTorr, the applied power needed would be very high, with an attendant high sheath voltage. This causes severe ion bombardment of the substrate surface. To decouple the bias voltage on the substrate from the applied power needed to create and maintain the plasma, inductively-coupled plasma (ICP) systems become necessary. In ICP systems, the plasma is generated via a resonant inductive coil in an upper section of a chamber. Below, in the same chamber, the substrate is placed on a pedestal, which can be powered separately using another power supply. A set of solenoids can also be used in the upper chamber to confine the electrons and adjust the conductivity of the plasma, producing a uniform plasma in the upper chamber at pressures in the range 1 to 50 mTorr. The degree of ionization and activation can be very high, producing a very reactive plasma. In the lower chamber, the substrate pedestal can either be unpowered or powered, depending on the sheath voltage desired.

Other low pressure plasma generation techniques used in plasma etching are microwave cavities and microwave electron cyclotron resonance (uECR). ECR plasmas operate even below 1 mTorr, and ionization efficiencies are again very high, due to the resonance between the cyclotron frequency of the electron and the microwave excitation field. The substrate can also be independently biased using a power supply for increasing ion bombardment as desired.

Helicon plasma sources are also used in low pressure etching. In this case radio frequency waves are generated from an antennae. A solenoid magnetic field is also applied in addition to the RF field. Right hand circularly polarized helicon waves at a smaller wavelength than the RF waves pass through the plasma and ionize the gas.

Ion beam etching, typified by ion milling, reactive ion milling, and Gas Cluster Ion Beam (GCIB) etching are also low pressure (sub mTorr to a few mtorr) etching methods using ions extracted from a plasma. In the case of GCIB, the source of the clusters is a expanding gas, which is ionized and then accelerated towards the substrate.

Plasma enhancement can be carried out by with a magnetron assist, laser assist, and triode assist. These methods provide for a lower pressure operation and more uniform etching.

Plasma etching as embodied in the inventive process can be extended to include any of these manifestations of the plasma, down to sub-millitorr pressure range.

In another embodiment, the second electrodes 722 can be formed using a blanket deposition and a conventional lithographic technique. More specifically, the layer(s) for the second electrodes 722 can be deposited as previously described, except that a stencil mask would not be used, and therefore, substantially all of the array for the electronic device 100 or substantially all of the substrate 300 would be covered by the layer(s) for the second electrodes 722. A masking layer (not shown) is formed using a conventional technique, such as depositing a photoresist layer and selectively exposing the photoresist layer using a stencil mask and developing the photoresist layer to form an opening in the masking layer similar to the opening 724 as illustrated in FIGS. 7 and 8. The layer(s) for the second electrodes 722 are etched using a conventional technique to form the second electrodes 722. The etch may be performed using a conventional wet or dry etching technique.

After forming the second electrodes 722, the masking layer is removed using a conventional technique. In one specific embodiment, the masking layer and the organic layer 630 include organic material(s). The masking layer and exposed portion of the organic layer 630 underlying opening 724 are removed. In one embodiment, the removal may be performed using plasma etching as previously described. In one specific embodiment, the masking layer is significantly thicker that the organic layer 630. Therefore, exposed portion of the organic layer 630 will be removed before all of the masking layer is removed. If endpoint detection is used for the plasma etching, the endpoint signal can be set to detect when the second electrodes 722 are exposed.

At this point in the process, the second electrodes 722, whether patterned as deposited or blanket deposited and patterned, and the opening 1024 are formed. In one embodiment, the first organic layer 632 includes a relatively conductive material. After removing the exposed portion of the organic layer 630, the substrate can be exposed to a material that reduces the conductivity of one or more of the layers within the organic layer 630. In one embodiment, the first organic layer 632 is a sulfonated PANI-PSS or PEDOT-PSS. If a conductive member formed within the opening 1024 contacts the PANI-PSS or PEDOT-PSS, a leakage path between such conductive member and the first electrodes 442 can result. A base is exposed to the PANI-PSS or PEDOT-PSS material within the first organic layer 632 to form a resistive portion 1046 of the first organic layer 632. The base can include a Group 1 or Group 2 metal-containing base, such as sodium hydroxide, calcium hydroxide, etc., a non-metallic base, such as tetramethyl ammonium hydroxide, or any combination thereof.

In one specific embodiment, the base interacts with the sulfonated portions of the PANI-PSS or PEDOT-PSS to form the resistive portion 1046 as illustrated in FIG. 10. The resistive portions 1046 lie along the perimeter of the opening 1024 and other portions of the electronic device 100 where the first organic layer 632 is exposed to the base.

Figure 11:
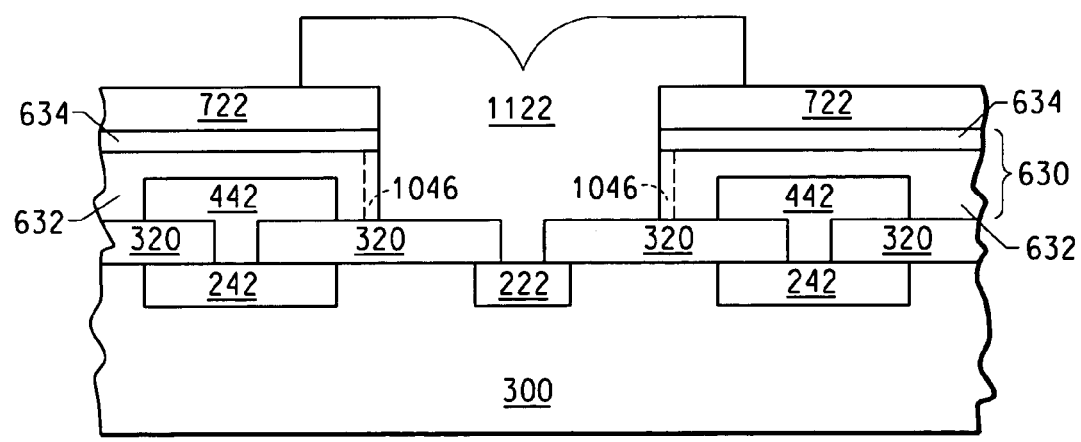
FIG. 11 includes an illustration of a cross-sectional view of the substrate of FIGS. 9 and 10 after forming a conductive member that is connected to at least some of the second electrodes and the exposed conductive member.

A third conductive member 1122 is formed over at least portions of the second electrodes 722 and within the opening 1024 to form a contact to the second conductive member 222 as illustrated in FIG. 11. The third conductive member 1122 may include any one or more of the materials previously described with respect to any of the second conductive member 222. The third conductive member 1122 can have the same or different composition compared to the second conductive member 222. In one embodiment, the third conductive member 1122 can be formed by depositing one or more layers using a stencil mask having a pattern that is nearly the reverse image of the stencil mask used for creating the second electrodes 722. In this embodiment, the opening for the third conductive member is typically a little wider than the opening 724 as previously described. In this manner, the overlap onto the second electrodes 722 can allow for better contact and some misalignment of the third conductive member (e.g., not centered over the opening 1024.

The third conductive member 1122 may be the same thickness or substantially thicker than the thickness of the second electrodes 722. In one embodiment, the third conductive member has a thickness in a range of approximately 0.1-5.0 microns. The third conductive member 1122 connects the second conductive member 222 to the second electrodes 722. In this specific embodiment, the third conductive member 1122 also contacts the second electrodes 722 and the second conductive member 222. In this manner a $V_{ss}$ signal can be transmitted along the second conductive member 722, which is at least part of the $V_{ss}$ line 148, through the third conductive member 1122 to the second electrodes 722. The resistive portions 1046 help to reduce leakage current flowing from the third conductive member 1122 to the first electrodes 442.

In another embodiment, the third conductive member 1122 can be formed using a blanket deposition and lithographic technique previously described for the second electrodes 722. The surface of the second electrodes 722 may be different from the third conductive member 1122 so that the third conductive member 1122 can be etched selectively to the second electrodes 722.

In one embodiment, one third conductive member 1122 is formed. In another embodiment, additional third conductive members 1122 similar to the one illustrated in FIG. 11 may be formed.

Other circuitry not illustrated in FIGS. 1-11 may be formed using any number of the previously described or additional layers. Although not shown, additional insulating layer(s) and interconnect level(s) may be formed to allow for circuitry in peripheral areas (not shown) that may lie outside the array. Such circuitry may include row or column decoders, strobes (e.g., row array strobe, column array strobe), or sense amplifiers.

A lid with a desiccant can be attached to the substrate 300 at locations outside the array to form a substantially completed electronic device 100. In one embodiment, radiation can be emitted from or received by the organic active layer 632 via the user side 302 of the substrate 300. In this embodiment, the materials used for the lid and desiccant and the attaching process are conventional.

3. Alternative Embodiments

A number of additional alternative embodiments are described below. The alternative embodiments described herein are meant to illustrate and not limit the scope of the present invention as many other embodiments are possible.

Figure 12:
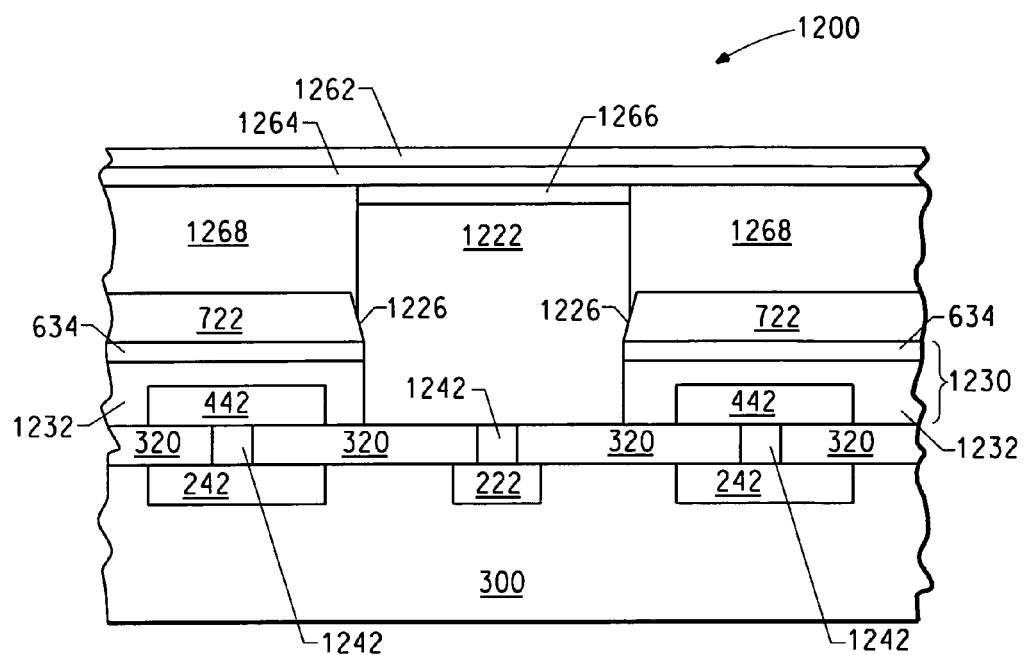
FIGS. 12 and 13 include illustrations of cross-sectional views of portions of electronic devices in accordance with alternative embodiments.

FIG. 12 includes a cross-sectional view of a portion of an electronic device 1200 formed in accordance with an alternative embodiment. In this embodiment, features includes conductive plugs 1242 extending through openings in the insulating layer 320, a resistive first organic layer 1232, a tapered opening 1226 and complementary tapered third conductive member 1222, and a lid including the third conductive member 1222. The portions of the fabrication process that are different from the embodiments illustrated or described with respect to FIGS. 2-11 are described below.

Formation of the electronic device 1200 through the formation of the patterned insulating layer 320 is substantially the same as previously described. Conductive plugs 1242 are formed within the openings of the insulating layer 320. The conductive plugs 1242 can be formed using a conventional technique used in the semiconductor arts. For example, the conductive plugs 1242 may be formed by depositing a layer of conductive material, such as any one or more of the materials previously described with respect to the second conductive member 222, and removing portion(s) overlying the insulating layer 320. In another embodiment, a selective deposition process can be used to form the conductive plugs 1242. In a specific embodiment, the selective deposition can be performed using a chemical vapor deposition or plating technique that initially deposits only within the openings within the insulating layer 320. The selective deposition may be terminated when the conductive plugs 1242 substantially fill the openings within the insulating layer 320. In another embodiment, the selective deposition may be performed slightly longer to allow the conductive plugs 1242 to extend slightly outside the openings in the insulating layer 320. First electrodes 442 are formed as previously described except that they contact some of the conductive plugs 1242 and are connected to but do not contact a conductive member within the underlying pixel driving circuit 242.

An organic layer 1230 is then formed over the first electrodes 442 and the insulating layer 320. The organic layer 1230 includes a resistive first organic layer 1232 that can comprise any one or more of the materials previously described for the first organic layer 632, except that a resistive form of the material may be used. For example, the resistive first organic layer 1232 may include PANI or PEDOT but it would not be sulfonated. In this manner, forming the resistive portion 1046, as previously described with respect to FIG. 10, is not required. The organic active layer 634 and layer(s) for the second electrodes 722 are formed as previously described. In this particular embodiment, a blanket deposition can be used for forming the layer(s) for the second electrodes 722, and a masking layer (not shown) is used to form a tapered opening 1226 as shown in FIG. 12. A conventional resist erosion process as used in the semiconductor arts can be performed to form the tapered opening 1226. In one embodiment, one or more halogen-containing gases can be used to etch the first electrodes while one or more oxygen-containing gases can be used to etch the masking layer in a lateral direction. Optionally, an inert gas may also be used. Some or all of the organic layer 1230 may be removed during the resist erosion portion of the etch. Any remaining portion of the masking layer and the organic layer 1230 between the second electrodes 722 are removed using a conventional technique. Note that the exposure of the resistive first organic layer 1232 to a base is not required.

A lid 1262 can include a desiccant 1264, a shock absorbing material 1266 (e.g., an elastic polymer), and the third conductive member 1222. The lid 1262 and desiccant 1264 are conventional.

The third conductive member 1222 may include any one or more of the materials previously described for the third conductive member 1122.

In this specific embodiment, a distal end of the third conductive member 1222 may be tapered to have a shape similar to the tapered opening 1226. The lid 1262 is attached to the substrate 300 at a location outside the array. While the lid 1262 is being attached, the third conductive member 1222 fits inside the tapered opening 1226 and contacts the second electrodes 722 and the conductive plugs 1242 that overlie the second conductive member 222. The shock absorbing material 1266 can allow some pressure on the third conductive member to ensure better contact with the second electrodes 722 and the conductive plugs 1242. In other embodiments, the desiccant 1264, shock absorbing material 1266, or both are not required. After encapsulation, a gap 1268 exists between the second electrodes 722 and the lid 1262.

Figure 13:
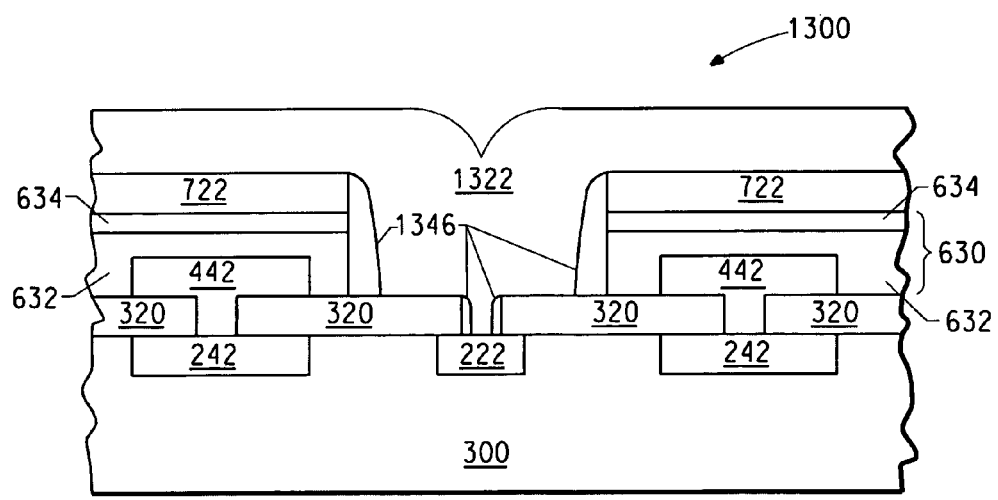

FIG. 13 includes a cross-sectional view of a portion of an electronic device 1200 formed in accordance with another alternative embodiment. In this embodiment, features include sidewall spacers 1346 and a third conductive member 1322 that covers substantially all of the array of the electronic device 1300. The portions of the fabrication process that are different from the embodiments illustrated or described with respect to FIGS. 2-11 are described below.

The formation of the opening 1042 through the organic layer 630 is performed in accordance with a prior embodiment through FIGS. 9 and 10 can be formed with the exception of not forming the resistive portion 1046. Instead, sidewalls spacers 1346 can be formed to insulate the subsequently-formed third conductive member 1322 from portions of the organic layer 630. In one particular embodiment, an insulating layer such as silicon dioxide, silicon nitride, other insulating material, or any combination thereof may be conformally deposited to a thickness in a range of 10 to 100 nm. In one embodiment, the insulating layer has a composition that is different from the insulating layer 320.

The insulating layer is anisotropically etched to form the sidewall spacers 1346. In an embodiment, any one or more of the halogen-containing gases, as previously described, can be used as a feed gas. At least one of the halogen-containing gas(es) includes hydrogen, such as $CHF_3$, HF, HCl, HBr, etc. The presence of the hydrogen helps to increase the anisotropic character of the etch. One or more inert gases, one or more oxygen-containing gases, or a combination thereof can be used in conjunction with the halogen-containing gases. The plasma etching conditions previously described may be used during the anisotropic etching. In one embodiment, the sidewall spacers 1346 and the insulating layer 320 have different compositions. Overetching during the formation of the insulating sidewall spacers 1346 can occur without etching too much of the insulating layer 320.

In another embodiment, the sidewall spacers 1346 can be formed using a conventional deposition and back sputtering technique as used in the semiconductor arts. More specifically, depositions and back sputtering actions can be alternated until sidewall spacers 1346 of a sufficient thickness are formed. In this embodiment, the sidewall spacers 1346 may have more of a triangular shape rather than parabolic as seen form a cross-sectional view.

In still another embodiment (not shown), the openings 224 within the insulating layer 320 at locations over the second conductive member 222 may not be formed. After forming the opening 742 as previously described, an insulating layer (for the sidewall spacers 1346) having substantially the same composition of the insulating layer 320 can be formed. The etch used to form the sidewall spacers 1342 would be continued to remove portions of the insulating layer 320 within the opening 742 that are not covered by the sidewall spacers 1346. A second conductive member 222 and a portion of the substrate 300 would become exposed. The third conductive member 1322 can be formed as previously described except that the third conductive member 1322 can extend over substantially all of the electronic components 128, all of the array for the electronic device 1300, or all of the substrate 300.

In yet another embodiment, the etch used to form opening 1024 can be extended to remove the portion of the insulating layer 320 not covered by the second electrodes 722. Therefore, the opening 1024 would expose the second conductive member 222 and a portion of the substrate 300. When the first organic layer 632 is present, the resistive portions 1046 or the sidewall spacers 1346 can be formed. When the relatively resistive first organic layer 1232 is present, the resistive portions 1046 or the sidewall spacers 1346 are not required but may be formed to further reduce leakage current. The third conductive member 1122, 1222, or 1322 can be formed or placed within the opening as previously described.

In still another embodiment, radiation may be transmitted through an opposite side of the electronic device 100. In this embodiment, the thickness of the second electrodes 722 may be substantially reduced in order to allow a substantial portion of radiation to be transmitted through the second electrodes 722. In one embodiment at least 70% of the radiation reaching the second electrodes 722 is transmitted through the second electrodes 722. In a particular embodiment, the thickness of the second electrodes 722 is less than 100 nm, and in a specific embodiment is in a range of approximately 10-50 nm. A transparent encapsulation layer, transparent lid, or a combination thereof may be used in order for the radiation to be transmitted through such encapsulation layer, lid, or combination thereof. If a desiccant is used, it should allow sufficient transmission of radiation or should be placed at locations where it would not substantially interfere with radiation being emitted from or received by the electronic device 100.

Additionally, other circuit configurations are possible. For example, referring to FIG. 1, the select transistors 122, the driving transistors 126, or both can be replaced by p-channel transistors. When the driving transistors 126 are replaced by p-channel transistors, the connections in FIG. 1 can be changed. In one embodiment, the anodes of the electronic component 128 are connected to the $V_{dd}$ line 146, which is a power transmission line, the cathodes of the electronic components 128 are connected to one of the source/drain regions of its corresponding driving transistor 126, and the other source/drain region of the corresponding driving transistor 126 is connected to the $V_{ss}$ line 148.

In one embodiment, referring to FIG. 11, fabrication of at least some of the layers within the electronic device 128 would be reversed, although the layout would be substantially the same. For example, the first electrodes 442 would be the cathodes for the electronic components 128. The first electrodes 442 would be connected to the appropriate source/drain regions of the driving transistors 126 within the pixel driving circuits 242. The fabrication of the layer(s) within the first electrodes 442 would be the reverse of the second electrodes 722 as previously described. The low work function material would be in contact with organic layer 630. The organic active layer 634 would be formed before the first organic layer 632. The second electrodes 722 would be the anodes for the electronic components 128. The third conductive member 1122 would connect the second electrodes 722 to the second conductive member 222, which in this embodiment is part of the $V_{dd}$ line 146. This embodiment may be useful in forming a top emission display without significant additional fabrication complexity.

A wide variety of electronic devices can be made using the layouts and processes described here. In one embodiment, the electronic device can include a display, where the display includes electronic components 128 that are radiation-emitting components. Embodiments described herein can be used for bottom emission (emission through the substrate) and top emission (emission through the encapsulating layer, lid, or both) displays. The electronic devices 100, 1200, 1300, or any combination thereof can include active matrix displays or be modified for use with passive matrix displays. In another embodiment, the electronic devices 100, 1200, 1300, or any combination thereof can include an array of radiation sensors or photovoltaic cells. In such an embodiment, the electronic components are radiation-responsive components.

Many other embodiments are possible but are not described. For example, after reading this specification, skilled artisans will know how to combine any one or more of the features for any of the described embodiments with each other to form new embodiments.

4. Advantages

The embodiments described herein may have any one or more of the advantages as described herein. In one embodiment, the substrate 300 including pixel driving circuits 242 may be fabricated by one manufacturer, and the electronic components 128 may be fabricated by a different manufacturer. The substrate 300 manufacturer may already include terminal connections and power transmission lines for the electronic device 100, 1200, or 1300. Therefore, the second conductive member 222 may already exist when the different manufacturer starts fabricating the electronic device 100, 1200, or 1300. The third conductive member 1122, 1222, 1322, or any combination thereof allows connections between the second electrodes 722 and the second conductive member 222 without consuming additional substrate area.

Additionally, the fabrication of the second electrodes 722 can be used to remove portions of the organic layer 630 or 1230 over the second conductive member 222. In one embodiment, the second electrodes 722 are a hard mask. In another embodiment, the organic layer 630 or 1230 removal can be incorporated with removing a masking layer that is used to pattern the second electrodes 722. Less masking or patterning layers need to be performed to remove those portions of the organic layer 630 that are not covered by the second electrodes 722.

In some of the embodiments, resistive portions 1046, sidewall spacers 1346, or a combination thereof can be used. The resistive portions 1046 or sidewall spacers 1346 allow a relatively more conductive first organic layer 632 to be used within the electronic components 128 to reduce power consumption. The resistive portions 1046, sidewall spacers 1346, or a combination thereof can significantly reduce current or substantially eliminate a leakage path that would otherwise lie between the first electrodes 442 and the third conductive member 1122 or 1322.

In the embodiment as illustrated in FIG. 12, the tapered edges between the third conductive member 1222 and the tapered opening 1226 can help align the third conductive member 1222, which is attached to the lid 1262, to the conductive plugs 1242. Also, a relatively less conductive first organic layer 1232 can be used, and in one embodiment, resistive portions 1046, sidewall spacers 1346, or both are not required.

In still another embodiment, openings 224 in the insulating layer 320 are not formed before forming the resistive portions 1046. In this embodiment, potential interaction between a base or other compound and the second conductive member 222 can be substantially eliminated. Such an embodiment can allow the second conductive member 222 to have an upper surface (i.e., closest to the third conductive member 1122 or 1322) comprise Al, which is extensively used in microelectronics for conductive members. More of the second conductive member 222 may be exposed during formation of the subsequent third conductive member 1122 or 1322 and allow a lower voltage drop between the second electrodes 722 and the second conductive member 222. The lower resistance can increase current flow may occur without a further increase in power consumption by the electronic device 100 or 1300. In this manner, the electronic device 100 or 1300 may be operated at a lower temperature and can extend the operating lifetime of the electronic components 128.

For at least some of the embodiments, another advantage is that the layout and fabrication can be used with top emission displays. More specifically, the third conductive members 1122 and 1222 can be designed so that they cover little if any of the underlying first electrodes 442. If the second electrodes 722 are significantly transparent to radiation (i.e., a transmission of at least 70% of the radiation to or from the organic layer 630 or 1230), the third conductive members 1122 and 1222 are bus lines to provide sufficient current to the electronic components 128.

The processes and materials as described herein are conventional within the organic electronic and semiconductor arts. Therefore, new materials or new process techniques do not need to be developed. The electrical connections between the second electrodes 722 and the second conductive member 222 can be formed by using as little as two additional processing steps, as compared to more conventional common cathode technologies that form the cathode over substantially all of the array. The two additional steps can include etching the organic layer 630 and forming the third conductive member that connect the second electrodes 722 to the second conductive member 222.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. A process for forming an electronic device comprising:
   forming a first electrode over a first conductive member within a substrate, wherein:
   the substrate comprises a first pixel driving circuit, the first conductive member, and a second conductive member;
   the first and second conductive members are spaced apart from each other;
   the first conductive member is connected to the first pixel driving circuit; and
   the second conductive member is part of a power transmission line;
   forming a first organic layer over the first and second conductive members;
   forming a second electrode over the first organic layer, wherein the second electrode does not lie over the second conductive member;
   removing an exposed portion of the first organic layer that is not covered by the second electrode to expose the second conductive niember; and
   forming a third conductive member that is:
   connected to the second electrode and the second conductive member; and
   contacts the second conductive member.

2. The process of claim 1, wherein:
   removing the exposed portion of the first organic layer forms a sidewall adjacent to the second conductive member; and
   the process further comprises forming a resistive portion of the first organic layer adjacent to the sidewall.

3. The process of claim 2, wherein forming the resistive portion of the first organic layer comprises exposing the first organic layer to a dry processing operation.

4. The process of claim 1, further comprising:
   forming an insulating layer after removing the exposed portion of the first organic layer; and
   anisotropically etching the insulating layer to form a sidewall spacer along a sidewall of the exposed portion of the first organic layer.

5. The process of claim 1, wherein:
   the substrate comprises:
   a plurality of pixel driving circuits including the first pixel driving circuit;
   additional first conductive members; and
   additional second conductive members, wherein each of the first conductive members is spaced apart from the second conductive mebers;
   the electronic device comprises an array of electronic components and pixel circuits lie within the array, wherein including a first electronic component;
   forming the first electrode comprises forming the first electrodes over the first conductive members;
   forming the second electrode comprises forming the second electrodes over the first organic layer, wherein the second electrodes do not lie over any of second conductive members within the array;
   removing the portion of the first organic layer comprises removing portions of the first organic layer that are not covered by the second electrode to expose the second conductive members; and
   forming the third conductive member comprises forming the third conductive member such that it is connected to the second electrodes and the second conductive members and contacts at least some of the second conductive members.

6. The process of claim 1, further comprising forming an organic active layer after forming the first electrode and before forming the second electrode.

7. The process of claim 5, wherein the first electronic component comprises a radiation-emitting electronic component or a radiation-responsive electronic component.

8. The process of claim 1, wherein the third conductive member contacts the second electrode.

9. The process of claim 1, wherein the power transrriission line is a $V_{dd}$ line or a $V_{ss}$ line.

* * * * *